US009372212B2

(12) United States Patent
Thiele (10) Patent No.: US 9,372,212 B2
(45) Date of Patent: Jun. 21, 2016

(54) CIRCUITS AND METHODS FOR MEASURING A CURRENT

(71) Applicant: Infineon Technologies AG, Neubiberg (DE)

(72) Inventor: Steffen Thiele, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 324 days.

(21) Appl. No.: 14/091,474

(22) Filed: Nov. 27, 2013

(65) Prior Publication Data

US 2015/0145538 A1  May 28, 2015

(51) Int. Cl.
*G01R 19/00* (2006.01)
*G01R 19/32* (2006.01)
*G01R 1/20* (2006.01)

(52) U.S. Cl.
CPC .............. *G01R 19/32* (2013.01); *G01R 1/203* (2013.01)

(58) Field of Classification Search
CPC ....... G01R 19/0092; G01R 19/10; H01C 7/10
USPC ......... 324/691, 704, 705, 713, 714, 720, 722, 324/723
See application file for complete search history.

(56) References Cited

U.S. PATENT DOCUMENTS

| 2002/0158654 | A1 | 10/2002 | Graf | |
|---|---|---|---|---|
| 2010/0134086 | A1* | 6/2010 | Theil | G01R 19/0092 323/312 |
| 2011/0095818 | A1* | 4/2011 | Sullivan | G01R 19/0092 330/124 R |
| 2012/0209346 | A1* | 8/2012 | Bikson | A61N 1/08 607/45 |

FOREIGN PATENT DOCUMENTS

DE      102004041886 A1    3/2006

* cited by examiner

*Primary Examiner* — Tung X Nguyen
*Assistant Examiner* — Robert P Alejnikov, Jr.

(57) ABSTRACT

A circuit is provided, including a first resistor, a second resistor which may have an adjustable resistance, and a control unit. The control unit may be configured to adjust the second resistor to have a first resistance at which a voltage due to a first current flowing through the first resistor is equal to a voltage due to a second current flowing through the second resistor. The control unit may be further configured to adjust the second resistor to have a second resistance at which a voltage due to another first current different from the first current and flowing through the first resistor is equal to the voltage due to the second current flowing through the second resistor. The control unit may be further configured to adjust the second resistor to have a third resistance based on at least a difference of the first resistance and the second resistance.

30 Claims, 6 Drawing Sheets

CIRCUITS AND METHODS FOR MEASURING A CURRENT

TECHNICAL FIELD

Various embodiments generally relate to circuits and methods for measuring a current, as well as methods for setting a ratio of a resistance of a first resistor to a resistance of a second resistor.

BACKGROUND

Currents may need to be measured, for example when controlling a load current or to provide over-current protection. The current may be measured by measuring another proportional current. The proportionality factor of the currents may be given by a resistance ratio. The accuracy of the measurement may depend on the accuracy of the resistance ratio. However, the resistance ratio may change over time and temperature and may be subject to manufacturing variations. The overall uncertainty may be as much as 28%.

The resistance ratio may be corrected after end of line testing. However, this usually involves additional costs and not all production technologies offer correction factors. Further, the use of correction factors will not solve the problems of drift over time and temperature.

SUMMARY

A circuit is provided, including a first resistor, a second resistor with an adjustable resistance and a control unit. The control unit may be configured to adjust the second resistor to have a first resistance at which a voltage due to a first current flowing through the first resistor is equal to a voltage due to a second current flowing through the second resistor. It may further be configured to adjust the second resistor to have a second resistance at which a voltage due to another first current different from the first current and flowing through the first resistor is equal to the voltage due to the second current flowing through the second resistor. It may still further be configured to adjust the second resistor to have a third resistance based on at least a difference of the first resistance and the second resistance.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the drawings, the left-most digit(s) of a reference number can identify the drawing in which the reference number first appears. The same numbers can be used throughout the drawings to reference like features and components. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
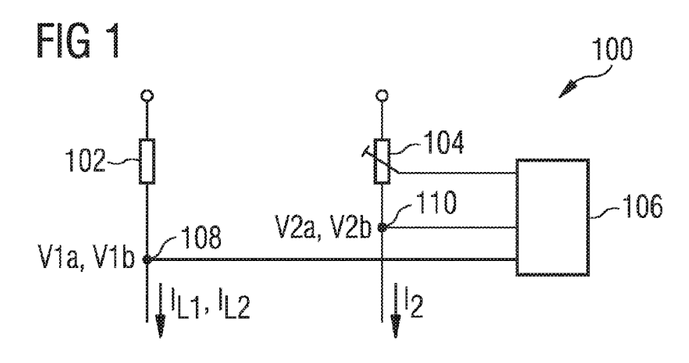
FIG. 1 shows an embodiment of a circuit for setting a resistance ratio.

FIG. 1 shows an embodiment 100 of a circuit including a first resistor 102, a second resistor 104 with an adjustable resistance and a control unit 106. The control unit 106 may be configured to adjust the resistance of the second resistor 104. A first current $I_{L1}$ flowing through the first resistor 102 may produce or cause a voltage V1a and another first current $I_{L2}$ flowing through the first resistor 102 may produce a voltage V1b. The voltage V1a and the voltage V1b may be voltages of a node 108 to which the first resistor 102 is electrically coupled or connected to. The another first current $I_{L2}$ may be different from the first current $I_{L1}$. A second current $I_2$ flowing through the second resistor 104 may produce or cause voltages V2a, V2b, depending on the resistance of the second resistor 104. The voltages V2a, V2b may be voltages of a node 110 to which the second resistor 104 is electrically coupled or connected to. The voltage V1a, the voltage V1b and the voltage V2 may be referenced to a same reference potential, for example a ground potential.

The control unit 106 may be configured to adjust the resistance of the second resistor 104 to have a first resistance X at which the voltage V1a due to the first current $I_{L1}$ flowing through the first resistor 102 is equal to the voltage V2a due to the second current $I_2$ flowing through the second resistor 104. The control unit 106 may be further configured to adjust the resistance of the second resistor 104 to have a second resistance Y at which the voltage V1b due the another first current $I_{L2}$ flowing through the first resistor 102 is equal to the voltage V2b due to the second current $I_2$ flowing through the second resistor 104. The control unit 106 may be still further configured to adjust the resistance of the second resistor 104 to have a third resistance Z based on a difference of the first resistance X and the second resistance Y.

In various embodiments, a ratio $K_1=I_{L1}/I_2$ of the first current $I_{L1}$ to the second current $I_2$ may be between 1,000 and 50,000. For example, it may be 20,000. However, the ratio $K_1$ is not limited to this range, it can be smaller than 1,000 or larger than 50,000. The ratio $K_1$ may be given by the ratio of the current to be measured, for example a load current Iload, to the current that is actually measured or sensed, for example a sense current Is.

In various embodiments, a ratio $K_2=I_{L2}/I_{L1}$ of the another first current $I_{L2}$ to the first current $I_{L1}$ may be between 1.1 to 20. For example, it may be 3. However, the ratio $K_2$ is not limited to this range. The another first current $I_{L2}$ may also be smaller than the first current $I_{L1}$. The ratio $K_2$ may be given by a ratio of a maximum resistance of the second resistor 104 to a minimum resistance of the second resistor 104.

In various embodiments, the first resistor 102 may be any resistor. It may for example be a current sense resistor, that is, a resistor configured to carry a large current with a low voltage drop.

In various embodiments, the second resistor 104 may be a reference resistor. It may have a discretely adjustable resistance, for example provided by switchable resistors. The resistance may for example be adjusted by connecting resistors in parallel or in serial to each other, for example by means of switches. Some or all of the resistors may have the same resistance. They may, for example, be poly-silicon resistors.

In various embodiments, at least one of the first resistor 102 and the second resistor 104 may have a continuously adjustable resistance, for example provided by a transistor. The resistance between two controlled terminals of a transistor, for example between the source and the drain of the transistor, may be adjusted by applying a signal to a control terminal of the transistor, for example to a gate terminal of the transistor. The transistor may act as an active resistance. It may, for example, be a MOSFET or a IGBT.

In various embodiments, the first resistor 102 and the second resistor 104 may consist of different materials. However, they can also consist of the same material, for example aluminum, which may reduce temperature dependencies. In various embodiments, the first resistor 102 and the second resistor 104 may be produced in the same production process, which may reduce production variations. For example, they may be formed in the same metallization layer. However, they can also be produced in different production processes. For example, the first resistor 102 may be a bond wire and the second resistor 104 may be a planar resistor made from the same material, for example aluminum. In various embodiments, the first resistor 102 and the second resistor 104 may consist of different materials and may be produced by different production processes. For example, the first resistor 102 may be a bond wire and the second resistor 104 may be a polysilicon resistor.

Figure 2:
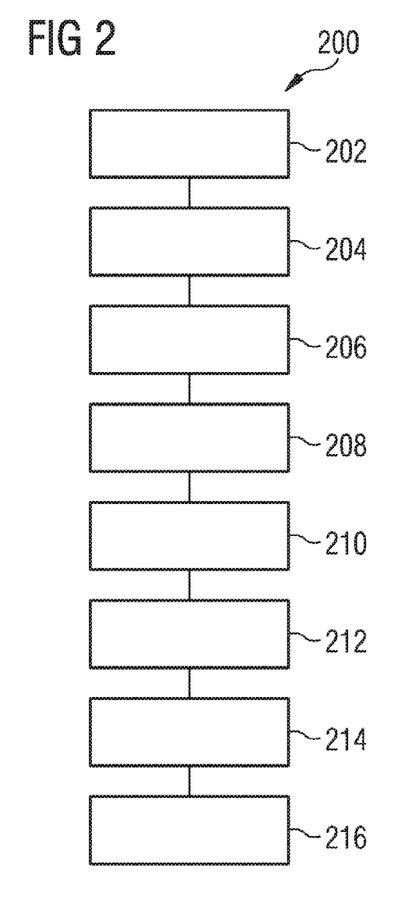
FIG. 2 shows an embodiment of a method for setting a resistance ratio.

FIG. 2 shows an embodiment 200 of a method for setting a ratio of a resistance of a first resistor to a resistance of a second resistor. The embodiment 200 may be applied to the embodiment 100 and vice versa.

The method may include a step 202 of applying a first current $I_{L1}$ to the first resistor 102 to obtain a first voltage V1a, a step 204 of applying a second current $I_2$ to the second resistor 104 to obtain a second voltage V2a, and a step 206 of obtaining a first value x of a control signal configured to set the resistance of the second resistor 104 by adjusting a value of the control signal until a difference between the first voltage V1a and the second voltage V2a vanishes or changes its sign. The steps 202 to 206 may be part of a first measuring phase. The control signal may be the control signal 328 shown in FIG. 3.

The method may further include a step 208 of applying another first current $I_{L2}$ to the first resistor 102 to obtain another first voltage V1b, wherein the another first current $I_{L2}$ differs from the first current $I_{L1}$, a step 210 of applying the second current $I_2$ to the second resistor 104 to obtain a another second voltage V2b, and a step 212 of obtaining a second value y of the control signal by adjusting the value of the control signal until the difference between the another first voltage V1b and the another second voltage V2b vanishes or changes its sign. The steps 208 to 212 may be part of a second measuring phase.

The method may still further include a step 214 of determining a third value z of the control signal based on the difference of the first value x and the second value y, and a step 216 of setting the resistance of the second resistor 104 by means of the third value z of the control signal.

In various embodiments, determining the third value z may be further based on at least one of a ratio $K_1$ of the first current $I_{L1}$ to the second current $I_2$, a ratio $K_2$ of the another first current $I_{L2}$ to the first current $I_{L1}$, and a target ratio $dK_{ILIS}$ of the resistance of the second resistor 104 to a resistance of the first resistor 102.

Figure 3:
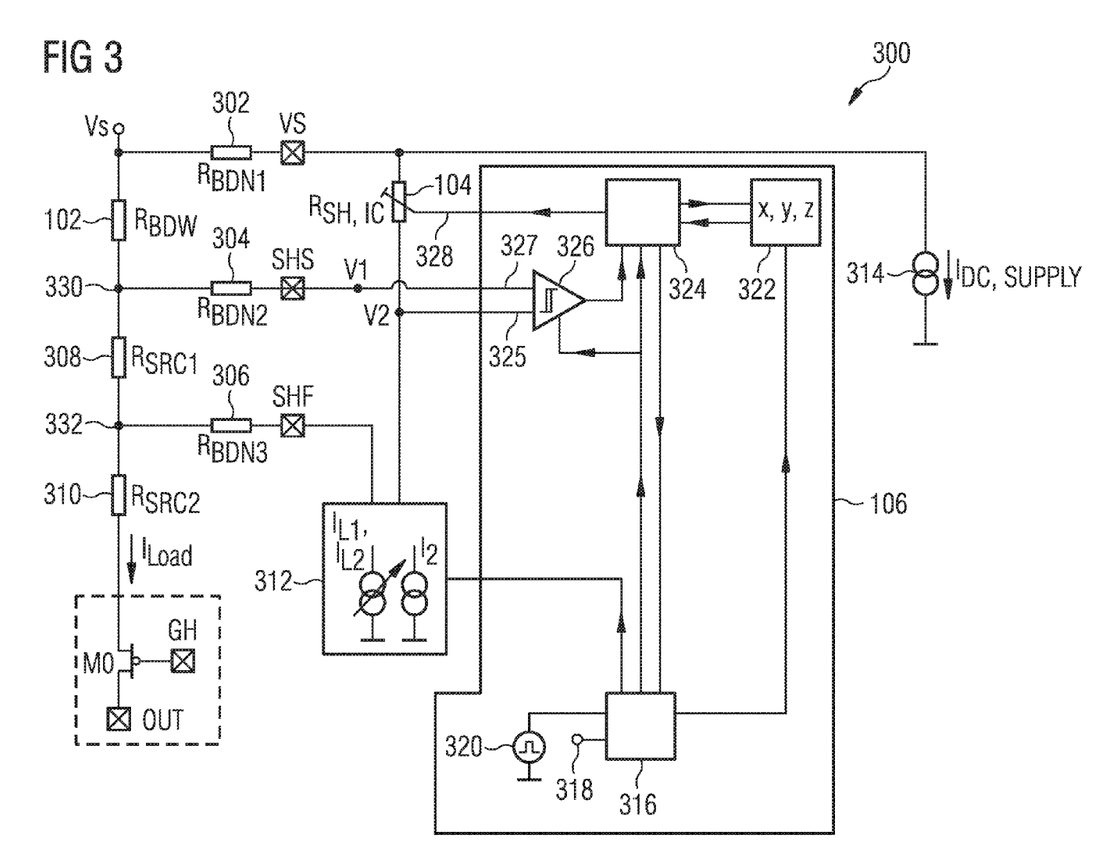
FIG. 3 shows an embodiment of a circuit for setting a resistance ratio.

FIG. 3 shows an embodiment 300 of a circuit. The embodiment 300 may illustrate the embodiment 100 of the circuit shown FIG. 1 and the embodiment 200 of the method shown in FIG. 2 in more detail. The features described in conjunction with embodiment 100 and embodiment 200 may also apply to embodiment 300 and vice versa.

The circuit may be used to set a ratio between a resistance $R_{SH,IC}$ of the second resistor 104 to a resistance $R_{BDW}$ of the first resistor 102. It may be desired to adjust the ratio $R_{SH,IC}/R_{BDW}$ to a target ratio $dK_{ILIS}$. While in principle the resistance of one of the first resistor 102 and the second resistor 104 may be varied, the first resistor 102 may be in the load current path and it may be difficult to access it or to vary it. It may therefore be easier to vary the second resistor 104.

Figure 6:
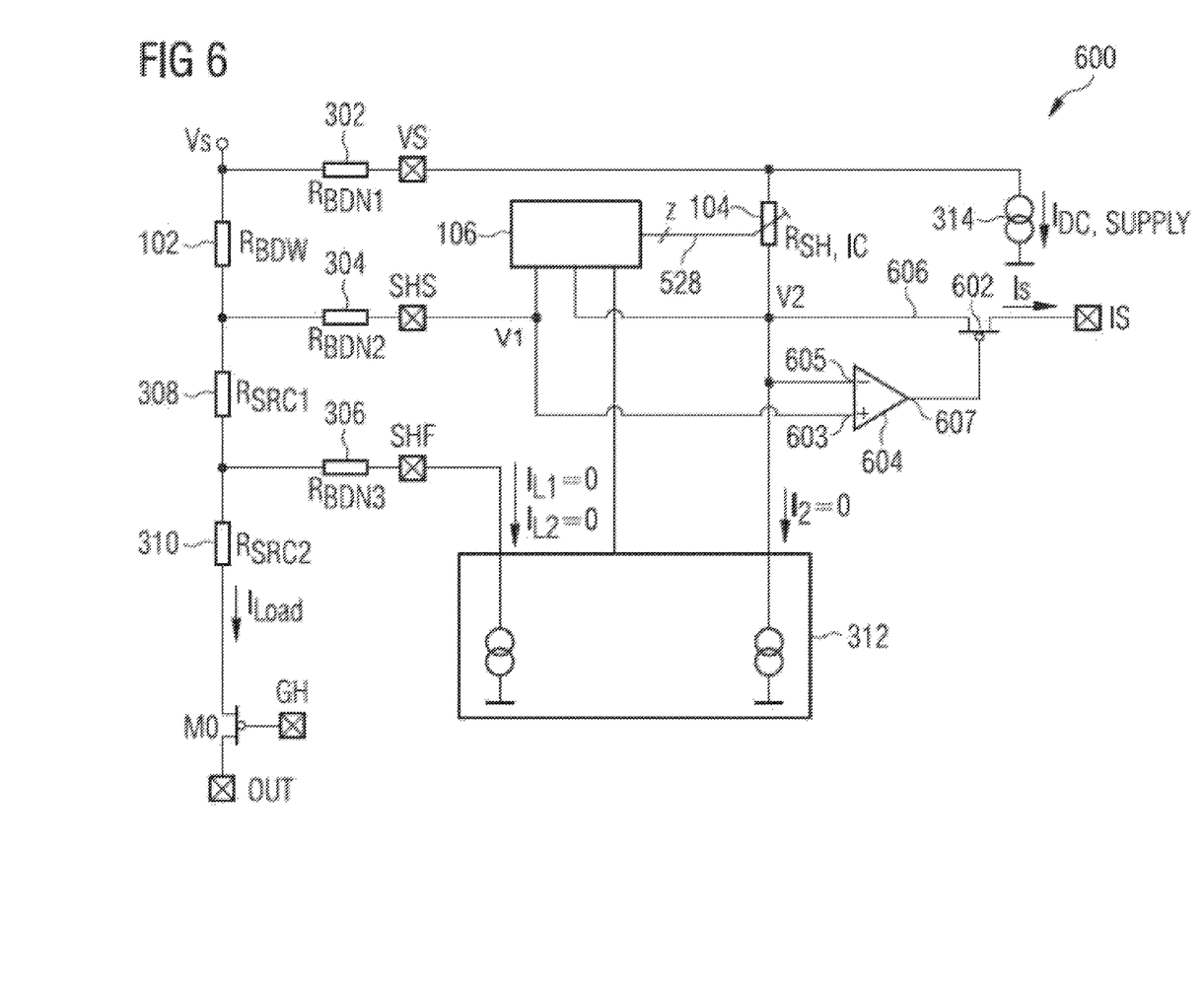
FIG. 6 shows an embodiment of a current measuring circuit.

As is described in conjunction with FIG. 6, the current Iload through a load coupled to terminal OUT may be determined from the current flowing through the second resistor 104 if the ratio between the resistance $R_{BDW}$ of the first resistor 102 and the resistance $R_{SH,IC}$ of a second resistor 104 is known. This ratio may be set to the target ratio $dK_{ILIS}$ by adjusting the resistance $R_{SH,IC}$ of the second resistor 104. The load current Iload may then be measured accurately since the resistance ratio is known accurately.

The first resistor 102 may be may be coupled between a supply voltage Vs and a load and may be used in so-called high-side current sensing. However, the first resistor 102 may also be coupled between the load and a reference potential, such as a ground potential GND, and may be used with the necessary modification of the circuit in so-called low-side current sensing. A switching element M0 may be coupled to the first resistor 102. The switching element M0 may be a transistor and may be activated by a signal applied to its control terminal GH to allow a current to flow from the supply voltage Vs through the load. A current flowing through the first resistor 102 may cause a voltage drop across it which may be used to determine the current.

The use of the circuit for setting the ratio between the resistance $R_{BDW}$ of the first resistor 102 and the resistance $R_{SH,IC}$ of the second resistor 104 is not limited to current measurement; it may also be used for current balancing in parallel paths, for example in current mirrors, where a fixed resistance ratio, for example of one, is needed. Another use of the circuit may be in measurement technology, where an exact ratio of resistances is needed, for example in calibration or in bridge circuits.

In various embodiments, the first resistor 102 may be a contact resistor, that is, a resistor formed by a contacting means. The contacting means may be used for electrically connecting the switching element M0 to the supply voltage Vs or a reference potential. The contact resistor may for example be a bond wire, for example consisting of aluminum. It may for example be part of or all of a metallization, such as a lateral metallization, of an electrode, for example of a source electrode, of the switching element M0.

In various embodiments, the circuit may have two connections 330, 332 to the first resistor 102. The two connections 330, 332 may for example connect a metallization of the switching element M0, such as a source electrode lateral metallization. The metallization may be coupled or connected to the supply voltage Vs via the first resistor 102, which may be a bond wire or a different part of the same metallization. The two connections 330, 332 may form two resistors 308 and 310. The resistors 308 and 310 may have resistances $R_{SRC1}$ and $R_{SRC2}$, respectively, depending on the location of the connections 330, 332 on the metallization. The location of the connections 330, 332 on the metallization may be chosen freely as long as all of the current flowing through the connection 332 with the switching element M0 turned off also flows through the first resistor 102.

The connection 330 may be coupled to a terminal SHS, for example via a bondwire 304 with a resistance $R_{BND2}$. The connection 332 may be coupled to a terminal SHF, for example via a bondwire 306 with a resistance $R_{BND3}$. The two connections 330, 332 may allow a current $I_{L1}$, $I_{L2}$ to flow through the first resistor 102 without having a current flowing in bond wire 304. A current flowing through the bond wire 304 may lead to incorrect measurements of V1, especially if $R_{BDN2}$ is not negligible with respect to $R_{BDW}$.

Bond wires 302, 304, 306 connecting terminal VS, SHS, SHF, respectively and resistors 308, 310 are shown to indicate possible ways of connections in the circuit. However, each of these elements may be replaced by other connecting methods and may be optional. For example, the circuit will also work without terminals VS, SHS, SHF and if the bond wires 302, 304, 306 and resistors 308, 310 are replaced by short circuits.

One end of the second resistor 104 may be coupled to the supply voltage Vs, for example via terminal VS and bond wire 302. Another end of the second resistor 104 may be coupled to a current supply 312. The resistance of the second resistor 104 may be controlled or set by a control signal 328.

A current source 314 with a current $I_{DC,SUPPLY}$ may be used to model current consumption of the circuit, for example of a control unit 106. One end of the current source 314 may be coupled to the terminal VS and to the second resistor 104. Another end of the current supply 314 may be coupled to a reference potential, such as a ground potential GND.

In various embodiments, the current supply 312 may be coupled to the first resistor 102 and the second resistor 104. The current supply 312 may be configured to provide the first current $I_{L1}$ and the another first current $I_{L2}$ to the first resistor 102 and to provide the second current $I_2$ to the second resistor 104. Embodiments of current supplies 312 are shown and described in more detail in conjunction with FIGS. 4 and 5.

The control unit 106 may be configured to set the current supply 312 to provide the first current $I_{L1}$ and the second current $I_2$ when adjusting the second resistor 104 to have the first resistance X. It may be configured to set the current supply 312 to provide the another first current $I_{L1}$ and the second current $I_2$ when adjusting the second resistor 104 to have the second resistance Y. The control unit 106 may be configured to turn off the first current $I_{L1}$, the another first current $I_{L2}$ and the second current $I_2$ after adjusting the second resistor 104 to have the third resistance Z.

In various embodiments, the control unit 106 may include a timing unit 316. The timing unit 316 may provide timing and control signals for the current supply 312, a resistor setting unit 324, a comparator 326 and a calculation unit 322. It may have an input connected to a clock signal 320. It may further have an input 318 for applying a signal to start setting the resistance ratio.

In various embodiments, the control unit 106 may include a resistor setting unit 324. The resistor setting unit 324 may set the resistance $R_{SH,IC}$ of the second resistor 104 by supplying a control signal 328 to the second resistor 104. The control signal 328 may for example operate switches which are used to add or subtract resistance, for example by connecting or disconnecting resistors in series or in parallel. The control signal 328 may for example be a signal which is applied to a control terminal such as a gate of a continuously variable resistance such as a transistor.

In various embodiments, the control unit 106 may include a comparator 326. The comparator 326 may be turned on and off by the timing unit 316. It may be turned on when the resistance ratio is set and it may be turned off after the resistance ratio has been set. It may be configured to compare the voltage V1 due to the first current $I_{L1}$ or due to the another first current $I_{L2}$ with the voltage V2 due to the second current $I_2$. If the voltage V1 and the voltage V2 are not equal, the output of the comparator 326 will cause the resistor setting unit 324 to change the resistance $R_{SH,IC}$ of the second resistor 104. If the voltage V1 and the voltage V2 are equal or if their difference has changed its sign compared to the sign before the output of the comparator 326 was changed, the output of the comparator 326 may cause the value of the control signal 328 to be stored in the calculation unit 322.

In various embodiments, the control unit 106 may include a calculation unit 322 configured to determine the third resistance Z. The third resistance Z may be determined or calculated based on at least one of the difference of the first resistance X and the second resistance Y, the ratio $K_1$ of the first current $I_{L1}$ to the second current $I_2$, the ratio $K_2$ of the another first current $I_{L2}$ to the first current $I_{L1}$, and the target ratio $dK_{ILIS}$ of the resistance $R_{SH,IC}$ of the second resistor 104 to a resistance $R_{BDW}$ of the first resistor 102. The third resistance Z may be supplied to the resistor setting unit 324 to set the resistance $R_{SH,IC}$ of the second resistor 104 to achieve the target ratio.

The calculation unit 322 may comprise a memory. The memory may be configured to store values x, y, z needed for setting the second resistor 104 to have the first resistance X, the second resistance Y and the third resistance Z. The values x, y, z may for example be integer values which may indicate how many unit resistors with a resistance of $R_T$ are to be connected in series. For example, $X = x \cdot R_T$, $Y = y \cdot R_T$ and $Z = z \cdot R_T$. The values x, y, z may for example be values which may be applied to a resistance circuit configured to have the first resistance X, the second resistance Y and the third resistance Z, respectively. For example, the values x, y, z may be voltage values and the resistance circuit may be a transistor. The voltage values x, y, z may be applied to a gate of the transistor.

Setting the target ratio $dK_{ILIS}$ may include a first measurement phase followed by a second measurement phase and a calculation phase. The load current Iload may set to be zero or to have a constant value during the first measurement phase and the second measurement phase.

In the first measurement phase, the control unit 106 may cause a first current $I_{L1}$ to flow through the first resistor 102 which may have a resistance $R_{BDW}$. The first current $I_{L1}$ may cause a voltage V1=V1a. The voltage V1a may be used as a reference voltage at a first input 327 of the comparator 326. Then, the control unit 106 may cause a second current $I_2$ to flow through the second resistor 104 which may have a resistance $R_{SH,IC}$. The second current $I_2$ may be smaller than the first current $I_{L1}$ and may cause a voltage V2a at a second input 325 of the comparator 326. The resistance $R_{SH,IC}$ of the second resistor 104 may be varied by varying the value of the control signal 328 supplied by the resistor setting unit 324, for example by starting from a extreme value such as its maximum value or its minimum value. The resistance $R_{SH,IC}$ may be adjusted until the comparator 326 detects a change in sign or a vanishing of the difference of the voltages V1a−V2a. At a resistance $R_{SH,IC} = x \cdot R_T$ the difference of the voltages V1a−V2a changes its sign or disappears. The value x of control value 328 may be stored by the calculation unit 322.

Starting from V1a=V2a and substituting resistances and currents yields Eq. 1:

$$R_{BDW} \cdot I_{LS} = R_{BDNS} \cdot I_2 + R_{BDN1} \cdot I_{DC,SUPPLY} + x \cdot R_T \cdot I_2 + U_{OFFSET,Komparator} \quad (1)$$

The supply current $I_{DC,SUPPLY}$ may need to be taken into account if the voltage difference caused by the first resistor 102 is very small.

In the second measurement phase, the above procedure is repeated with the another first current $I_{L2}$ instead of the first current $I_{L1}$. The another first current $I_{L2}$ may be different from the first current $I_{L1}$. However, the second current $I_2$ may be kept the same.

The resistance $R_{SH,IC}$ of the second resistor 104 may be varied again until the comparator 326 detects a change in sign or a vanishing of the difference of the voltages V1=V1b and V2=V2b. At a resistance $R_{SH,IC} = y \cdot R_T$ the difference of the voltages V1b−V2b changes its sign or disappears. The value y of control value 328 may be stored by the calculation unit 322.

Starting from V1b=V2b and substituting resistances and currents yields Eq. 2:

$$R_{BDW} \cdot I_{L2} = R_{BDNS} \cdot I_2 + R_{BDN1} \cdot I_{DC,SUPPLY} + y \cdot R_T \cdot I_2 + U_{OFFSET,Komparator} \quad (2)$$

In the computation phase, a value z is determined or calculated from the values x, y, the current ratios $K_1$, $K_2$ and the target ratio $dK_{ILIS}$. The value z may be used by the resistor setting unit 324 to set the resistance $R_{SH,IC}$ of the second resistor 104 to $R_{SH,IC} = z \cdot R_T$.

Assuming that the supply current $I_{DC,SUPPLY}$ and the comparator offset $U_{OFFSET,Komparator}$ remain constant, subtracting Eq. 1 from Eq. 2 and reordering yields:

$$R_{BDW}(I_{L2} - I_{L1}) = (y - x) \cdot R_T \cdot I_2 \quad (3)$$

The resistance $R_{BDW}$ of the first resistor 102 may be substituted by:

$$R_{BDW} = \frac{R_{SH,IC}}{dK_{ILIS}} \quad (4)$$

where $dK_{ILIS}$ may represent the target ratio. Further substituting $R_{SH,IC}$ by $R_{SH,IC} = z \cdot R_T$ yields:

$$\frac{z \cdot R_T}{dK_{ILIS}} \cdot (I_{L2} - I_{L1}) = (y - x) \cdot R_T \cdot I_2 \quad (5)$$

Solving for z gives the number of unit resistors with a resistance $R_T$ that is required to obtain the target ratio:

$$z = (y - x) \cdot dK_{ILIS} \cdot \frac{I_2}{(I_{L2} - I_{L1})} \quad (6)$$

It may be difficult to produce absolute values of currents $I_{L1}$, $I_{L2}$ and $I_2$ accurately. However, ratios of currents may be reproduced accurately. Using $$I_2 = \frac{I_{L1}}{K_1} \quad (7)$$

and $$I_{L2} = K_2 \cdot I_{L1} \quad (8)$$

in Eq. 6 yields:

$$z = (y - x) \cdot \frac{dK_{ILIS}}{K_1} \cdot \frac{1}{(K_2 - 1)} \quad (9)$$

The accuracy of the ratios $K_1$, $K_2$ may determine the accuracy with which the ratio of the resistance $R_{SH,IC}$ of the second resistor 104 to the resistance $R_{BWD}$ of the first resistor 102 may be set. Embodiments of current supplies 312 which may apply such accurate ratios are described in conjunction with FIGS. 4 and 5.

Figure 4:
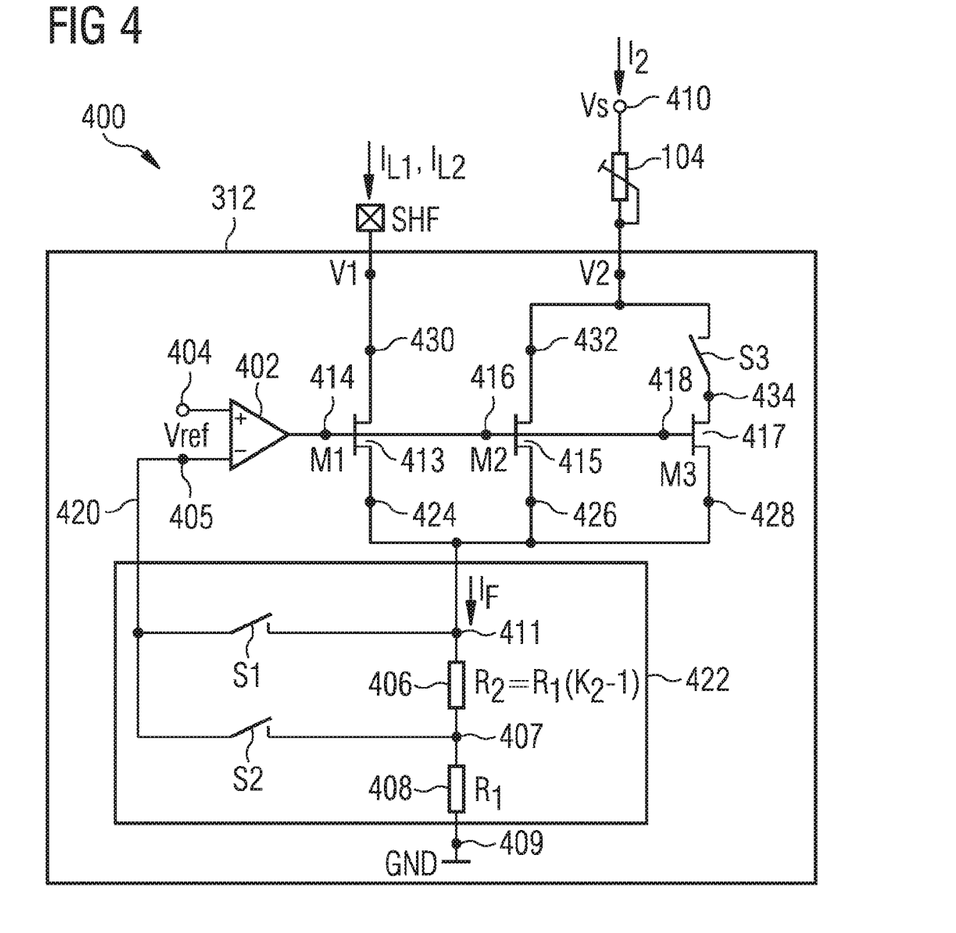
FIG. 4 shows an embodiment of a current supply.

FIG. 4 shows an embodiment 400 of a current supply 312. The embodiment 400 illustrates the current supply shown FIG. 3 in more detail. The features described in conjunction with embodiment 300 may also apply to embodiment 400 and vice versa.

In various embodiments, the current supply 312 may include a first transistor 413, a second transistor 415 and a third transistor 417. A controlled terminal 430 of the first transistor 413 may be coupled to the first resistor 102, for example via terminal SHF. A controlled terminal 432 of the second transistor 415 may be coupled to the second resistor 104. A controlled terminal 434 of the third transistor 417 may be coupled via to the second resistor 104, for example via a third switch S3. A gate 414 of the first transistor 413, a gate 416 of the second transistor 415 and a gate 418 of the third transistor 417 may be coupled together and may be controlled by a feedback loop 420. The feedback loop 420 may include a switchable voltage divider 422 and an operational amplifier 402. The operational amplifier 402 may include a positive input 404 which may be coupled to a reference voltage Vref and a negative input 405 which may be coupled to the feedback loop 420. The switchable voltage divider 422 may be coupled to another controlled terminal 424 of the first transistor 413, another controlled terminal 426 of the second transistor 415 and another controlled terminal 428 of the third transistor 417. It may include a resistor 406, a resistor 408, a first switch S1 and a second switch S2. The resistor 406 may have a resistance of $R_2 = R_1 \cdot (K_2 - 1)$ and the resistor 408 may have a resistance of $R_1$. The resistor 406 and the resistor 408 may be connected in series to each other. One end 409 of the series connection may be coupled to another reference potential, for example to a ground potential GND. The other end 411 of the series connection may be coupled to the another controlled terminal 424 of the first transistor 413, the another controlled terminal 426 of the second transistor 415 and the another controlled terminal 428 of the third transistor 417. The first switch S1 may couple the other end 411 of the series connection to the negative input 405 of the operational amplifier 402. A node 407 at which the resistor 406 and the resistor 408 are coupled together may be coupled via the second switch S2 to the negative input 405 of the operational amplifier 402.

Operating the third switch S3 may change the second current $I_2$. When the third switch S3 is closed, the second transistor 415 and the third transistor 417 are connected in parallel to each other and the currents flowing through them are added. When the third switch S3 is open, the second current $I_2$ is made up of only the current flowing through the second transistor 415. If the current $I_F$ through the switchable voltage divider 422 is held constant, this may result in different currents $I_{L1}$, $I_{L2}$ flowing through the first resistor 102, as is desired. However, the current $I_2$ flowing through the second resistor 104 may also change.

To keep the second current $I_2$ constant, it may be necessary to change the current $I_F$ through the switchable voltage divider 422 when operating the third switch S3. The current $I_F$ through the switchable voltage divider 422 may be changed by operating the first switch S1 and the second switch S2. The first switch S1 and the second switch S2 may change the resistance in the feedback loop 420 so that a different current $I_F$ is needed to regulate the other end 411 of the switchable voltage divider 422 to have a voltage equal to Vref. The resistances of the resistors 406, 408 of the switchable voltage divider 422 may be chosen so that the change in current $I_2$ through the second resistor 104 caused by operating the switch S3 is compensated and current $I_2$ is kept constant. Operating the first switch S1 and the second switch S2 at the same time as operating the third switch S3 will allow different currents $I_{L1}$ and $I_{L2}$, to flow through the first resistor 102 while keeping current $I_2$ through the second resistor 104 the same.

While the switchable voltage divider 422 is shown with two switches S1 and S2, different arrangements of switchable voltage dividers are possible. For example, the switchable voltage divider may have a single switch in parallel to the resistor 406 or in parallel to the resistor 408. Or, instead of connecting resistors 406 and 408 in series, they could also be connected in parallel to each other.

During the first measurement phase, the first switch S1 and the third switch S3 may be closed, that is conducting, and the second switch S2 may be open, that is non-conducting. The operational amplifier 402 may force the other end 411 of the series connection to have a voltage equal to Vref, which causes a current $I_{F1}$ to flow through the series connection of the resistor 406 and the resistor 408. Current $I_{F1}$ may be determined by the resistance of the series connection as $I_{F1}=\text{Vref}/(R_1(K_2-1)+R_1)=\text{Vref}/(R_1 \cdot K_2)$. Current $I_{F1}$ may be the sum of the first current $I_{L1}$ through the first transistor 413 and the first resistor 102 and of the second current $I_2$, where the second current $I_2$ flows through the second resistor 104 and is made up of the currents through the second transistor 415 and the third transistor 417. The voltage Vref applied to the positive input 404 of the operational amplifier 402 may remain unchanged during the first measurement phase and the second measurement phase.

During the second measurement phase, the first switch S1 and the third switch S3 may be open and the second switch S2 may be closed. The operational amplifier 402 may force node 407 of the series connection to have a voltage equal to Vref, which causes a current $I_{F2}$ to flow through the series connection. Current $I_{F2}$ may be determined by the resistance of the resistor 408 as $I_{F2}=\text{Vref}/R_1$. Current $I_{F2}$ may be the sum of the another first current $I_{F2}$ through the first transistor 413 and the first resistor 102 and of the second current $I_2$, where the second current $I_2$ flows through the second resistor 104 and the second transistor 415.

In various embodiments, the ratio $K_1=I_{L1}/I_2$ of the first current $I_{F1}$ to the second current $I_2$ may be set by a ratio of transistor geometries. The transistor geometry may be given by a ratio M=W/L of a width W of a channel of a transistor to a length L of a channel of a transistor. The transistor geometry may determine the conductivity of a transistor. The ratio of transistor geometries may be a first transistor geometry M1=W1/L1 of the first transistor 413 to a second transistor geometry M23=W23/L23. The second transistor geometry M23 may be an effective transistor geometry of the second transistor 415 and the third transistor 417. Since the second transistor 415 and the third transistor 417 are connected in parallel, their conductivities may be added. The effective transistor geometry M23 may be M23=M2+M3 with M2=W2/L2 being the transistor geometry of the second transistor 415 and M3=W3/L3 being the transistor geometry of the third transistor 417. The ratio $K_1$ may be set by $K_1$=M1/(M2+M3). If, on the other hand $K_1$ and $K_2$ are given, the transistors may be dimensioned as: M1/M2=$K_1 \cdot K_2$ and M3/M2=$K_2$−1.

In various embodiments, the ratio $K_2=I_{F2}/I_{L1}$ of the another first current $I_{F2}$ to the first current $I_{L1}$ may be set by a ratio of the current $I_{F2}=\text{Vref}/R_1$ flowing through the switchable voltage divider 422 in the second measurement phase to the current $I_{F1}=\text{Vref}/(R_1 \cdot K_2)$ flowing through the switchable voltage divider 422 in the first measurement phase. The ratio of currents may be set by a ratio of the resistance of the switchable voltage divider 422 in the first measurement phase to the resistance of the switchable voltage divider 422 in the second measurement phase. The resistance during the first measurement phase is the sum of the resistances of resistor 406 and resistor 408, that is $R_1+R_2=R_1+R_1 \cdot (K_2-1)=R_1 \cdot K_2$ and the resistance during the second measurement phase is $R_1$. The actual value of $R_1$ cancels when forming the ratio and the ratio of R2 to R1 is $R_1 \cdot (K_2-1)/R_1=K_2-1$, which is independent of $R_1$.

In embodiment 400, both the first resistor 102 and the second resistor 104 may be supplied with current during the first measurement phase and the second measurement phase.

Figure 5:
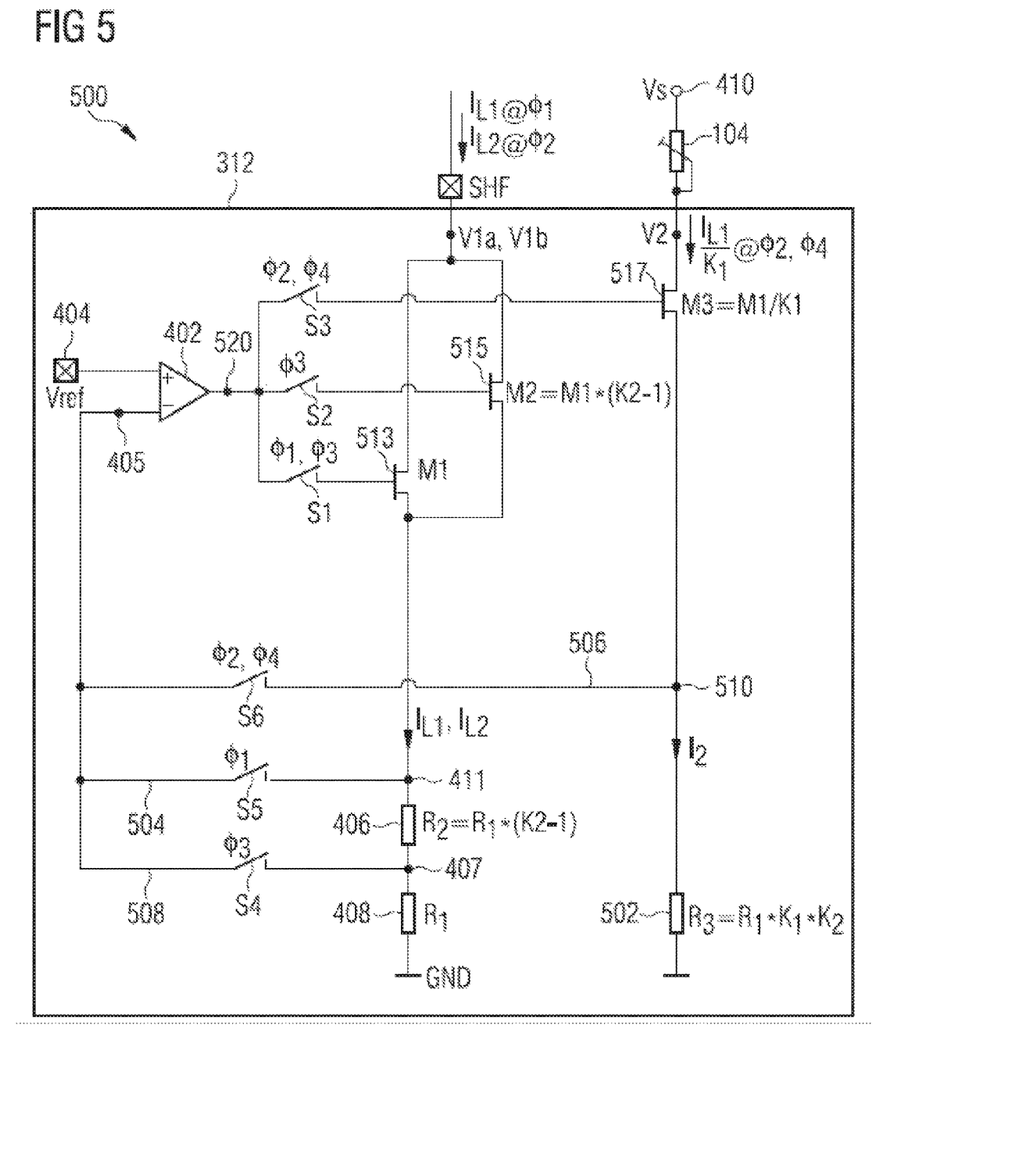
FIG. 5 shows an embodiment of another current supply.

FIG. 5 shows another embodiment 500 of the current supply 312. The embodiment 500 illustrates the current supply shown FIG. 3 in more detail. The features described in conjunction with embodiment 300 may also apply to embodiment 500 and vice versa.

In various embodiments, the current supply 312 may include a first transistor 513, a second transistor 515 and a third transistor 517. The first transistor 513 and the second transistor 515 may be coupled in parallel to each other and may be coupled to the first resistor 102, for example via terminal SHF. The third transistor 517 may be coupled to the second resistor 104.

The current supply 312 may further include a first feedback loop 504, a second feedback loop 506 and a third feedback loop 508. The first feedback loop 504 may include an operational amplifier 402, the first transistor 513 and a series connection of a resistors 406 and a resistor 408. The series connection of the resistors 406 and 408 may have one end connected to a reference potential, such as the ground potential GND and another end 411 coupled to a controlled terminal of the first transistor 513 and a controlled terminal of the second transistor 515. The series connection may have a node 407 at which the resistor 406 and 408 are coupled to each other.

The second feedback loop 506 may include the operational amplifier 402, the third transistor 517 and a resistor 502. One end of the resistor 502 may be connected to a reference potential, such as the ground potential GND and another end 510 of the resistor 502 may be coupled to a controlled terminal of the third transistor 517.

The third feedback loop 508 may include the operational amplifier 402, the first transistor 513 and the second transistor 515 connected in parallel to each other, and the series connection of the resistors 406 and 408.

An output 520 of the operational amplifier 402 may be coupled to the respective control inputs of the first transistor 513, the second transistor 515 and the third transistor 517. A positive input 404 of the operational amplifier 402 may be coupled to a reference potential Vref. In various embodiments, the first feedback loop 504, the second feedback loop 506 and the third feedback loop 508 may share the same operational amplifier 402. This may result in more stable ratios of the currents $I_{L1}$, $I_2$, and $I_{L2}$ as these ratios will only depend on the ratios of the resistances of the resistors 406, 408, and 510 if the offset of the operational amplifier 402 remains constant.

A switch S1 may be coupled between the control input of the first transistor 513 and the output 520 of the operational amplifier 402. A switch S2 may be coupled between the control input of the second transistor 515 and the output 520 of the operational amplifier 402. A switch S3 may be coupled between the control input of the third transistor 517 and the output 520 of the operational amplifier 402. A switch S4 may be coupled between the node 407 and the negative input 405 of the operational amplifier 402. A switch S5 may be coupled between the other end 411 of the series connection and the negative input 405 of the operational amplifier 402. A switch S6 may be coupled between the other end 510 of the resistor 502 and the negative input 405 of the operational amplifier 402. The switches S1 to S6 may be controlled by the control unit 106 to be closed or open, that is to be conducting or non-conducting.

In various embodiments, the current supply 312 may be configured to control the first transistor 513 to provide the first current $I_{L1}$ via the first feedback loop 504, to control the third transistor 517 to provide the second current $I_2$ via the second feedback loop 506, and to control the first transistor 513 and the second transistor 515 to provide the another first current $I_{L2}$ via the third feedback loop 508.

In various embodiments, the current supply 312 may be further configured to provide the first current $I_{L1}$, the second current $I_2$, the another first current $I_{L2}$ and the second current $I_2$ in that order. The current supply 312 may be further configured to provide only one of the first current $I_{L1}$, the second current $I_2$, the another first current $I_{L2}$ at a time. For example, the first current $I_{L1}$ may be turned off before the second current $I_2$ is provided. The second current $I_2$ may be turned off before the another first current $I_{L2}$ is provided. The another first current $I_{L2}$ may be turned off before the second current $I_2$ is again provided.

The transistors 513, 515 and 517 and the switches S1 to S6 may be controlled, for example by the control unit 106, in four phases Φ1, Φ2, Φ3 and Φ4 to sequentially provide the first current $I_{L1}$, the second current $I_2$, the another first current $I_{L2}$ and the second current $I_2$. The phases Φ1 and Φ2 may be part of the first measuring phase and the phases Φ3 and Φ4 may be part of the second measuring phase.

During the first phase Φ1, switch S1 and switch S5 may be closed and switches S2, S3, S4 and S6 may be open. The operational amplifier 402 may control the first transistor 513, for example via its gate, to force the other end 411 of the series connection to the reference potential Vref, which may cause a current $I_{L1}$ to flow through the series connection of the resistor 406 and the resistor 408. Current $I_{L1}$ may be determined by the resistance of the series connection $R_1+R_2=R_1+R_1\cdot(K_2-1)=R_1\cdot K_2$ as $I_{L1}=Vref/(R_1\cdot K_2)$.

In various embodiments, the voltage V1a due to the first current $I_{L1}$ may be stored or may be used as an offset for the comparator 326.

During the second phase Φ2, switch S3 and switch S6 may be closed and switches S1, S2, S4 and S5 may be open. The operational amplifier 402 may control the third transistor 517, for example via its gate, to force the other end 510 of the resistor 502 to the reference potential Vref, which may cause a current $I_2$ to flow through the resistor 502. Current $I_2$ may be determined by the resistance $R_3=R_1\cdot K_1\cdot K_2$ of the resistor 502 as $I_2=Vref/(R_1\cdot K_1\cdot K_2)$.

The resistance $R_{SH,IC}$ of the second resistor 104 may be adjusted using the control unit 106 as described in conjunction with FIG. 3 to achieve V1a=V2a. However, the voltage V1a may not be available in the circuit at the same time as the voltage V2a is available. In various embodiments, a stored value of the voltage V1a may be applied at an input 327 of the comparator 326, for example by applying a stored value to a digital-to-analogue converter.

In various embodiments, the value of V1a may be used as an offset for the comparator 326. In this way, smaller signals may be used, allowing lower values of $I_{L1}/I_{L2}$.

At the end of phase Φ2, the corresponding control value 328, for example the value x or a voltage level, may be provided by the resistor setting unit 324 and may be stored in the calculation unit 322.

During the third phase Φ3, switch S1, switch S2 and switch S4 may be closed and switches S3, S5 and S6 may be open. The operational amplifier 402 may control the first transistor 513 and the second transistor 515, for example via their gates, to force node 407 between the resistors 406 and 408 to the reference potential Vref, which may cause a current $I_{L2}$ to flow through the series connection of the resistor 406 and the resistor 408. Current $I_{L2}$ may be determined by the resistance $R_1$ of resistor 408 as $I_{L2}=Vref/R_1$.

In various embodiments, the voltage V1b due to the another first current $I_{L2}$ may be stored or may be used as an offset for the comparator 326.

The fourth phase Φ4 may be the same as the second phase Φ2, with the same setting of the switches, the same feedback loop 506 and the same current $I_2=Vref/(R_1\cdot K_1\cdot K_2)$. The resistance $R_{SH,IC}$ of the second resistor 104 may again be adjusted using the control unit 106 as described in conjunction with FIG. 3 to achieve V1b=V2b. Again, voltage V1b may not be present at the same time as voltage V2b so that a stored value V1b may be applied to the comparator 326 or the voltage V1b may be used as an offset for the comparator 326. At the end of phase Φ4, the corresponding control value 328, for example the value y or a voltage level, may be provided by the resistor setting unit 324 and may be stored in the calculation unit 322.

In various embodiments, the ratio $K_1=I_{L1}/I_2$ of the first current $I_{L1}$ to the second current $I_2$ may be set by $K_1=R_3/(R_1+R_2)$. In various embodiments, the ratio $K_2=I_{L2}/I_{L1}$ of the another first current $I_{L1}$ to the first current $I_{L2}$ may be set by $K_2=1+R_2/R_1$.

The reference voltage $V_{REF}$ applied to the positive input 404 of the operational amplifier 402 may be the same in all four phases Φ1, Φ1, Φ1 and Φ4. If further the offset voltage and the amplification of the operational amplifier 402 are kept the same, the voltage at the resistors 406, 408, 502 in the feedback loops 504, 506, 508 will also be the same, namely Vref.

In contrast to the embodiment 400 shown in FIG. 4, embodiment 500 has three independent control loops to separately set $I_{L1}$, $I_{L2}$ and $I_2$. It may therefore be easier to set the currents $I_{L1}$, $I_{L2}$ and $I_2$. Further, only one of the first resistor 102 and the second resistor 104 is supplied with current during the first measurement phase and the second measurement phase, so that the current consumption may be reduced.

In principle, there is no need to have different transistor geometries of the transistors 513, 515, 517 as the they do not share a common current through the switchable voltage divider. Further, the second transistor 515 may be omitted, as the current through the first transistor 513 and the first resistor 102 may be adjusted by switching the voltage divider using switches S4 and S5. In various embodiments, the current supply 312 may therefore include a first transistor 513 coupled to the first resistor 102 and a third transistor 517 coupled to the second resistor 104. The current supply 312 may be configured to control the first transistor 513 to provide the first current $I_{L1}$ via a feedback loop, to control the first transistor 513 and to control the feedback loop, for example by switching the voltage divider made up of resistors 406 and 408, to provide the another first current $I_{L2}$, and to control the third transistor 517 to provide the second current $I_2$ via a second feedback loop 506.

However, in various embodiments, the load conditions at the output 520 of the operational amplifier 402 may be held constant, for example to reduce second order effects of the operational amplifier 402. In various embodiments, this may be achieved by providing the same effective transistor geometries of the transistors 513, 515 and 517. The first transistor 513 may have a transistor geometry of M1, the second transistor 515 may have a transistor geometry of $M2=M1 \cdot (K_2-1)$ and the third transistor 517 may have a transistor geometry of $M3=M1/K_1$. The different widths of the transistors may change the capacitive load on the output 520 of the operational amplifier 402 which may be compensated for by adding parallel capacitors for the smaller gates or by providing an operational amplifier 402 with a stable output for all transistor widths. However, if such an operational amplifier 402 is used, the different rates of control speed may need to be considered for.

The ratios $K_1=R_3/(R_1+R_2)=1/(R_1/R_3+R_2/R_3)$ and $K_2=1+R_2/R_1$ may depend only on the ratio of the resistances of the resistors 406, 408, 502. A ratio of resistances may be produced with a variation of 1% to 2%, for example by matching. Even more accurate ratios are possible if the resistors 406, 408, 502 are formed in integrated circuits, for example by using laser cutting at wafer level.

FIG. 6 shows an embodiment 600 of a circuit which may be used for current measurement. The circuit may be based on the circuits and methods described in conjunction with FIGS. 1 to 5 and the features described in conjunction with embodiments 100 to 500 may also apply to embodiment 600 and vice versa. For simplification, the control unit 106 and the current supply 312 are shown as black boxes.

A load may be connected to terminal OUT. The transistor M0 may be controlled by a gate signal applied to its gate terminal GH to control a current Iload flowing through the load.

In various embodiments, the circuit may include an operational amplifier 604. The operational amplifier 604 may be configured to compare a voltage V1 due a current Iload in the first resistor 102 with a voltage V2 due to the current Is in the second resistor 104. A positive input 603 of the operational amplifier 604 may be coupled, for example via resistor 304, to the first resistor 102, for example, to an end of the first resistor 102 not connected to the supply voltage Vs. A negative input 605 of the operational amplifier 604 may be coupled or connected to the first resistor 102, for example, to an end of the second resistor 104 not connected to the supply voltage Vs.

In various embodiments, the circuit may further include a transistor 602 coupled to the second resistor 104. The transistor 602 may be controlled by the operational amplifier 604 in a feedback loop 606. One controlled terminal of the transistor 602 may be coupled or connected to the first resistor 102, for example, to an end of the second resistor 104 not connected to the supply voltage Vs. Another controlled terminal of the transistor 602 may be coupled or connected to a terminal IS. A current Is may flow between the controlled terminal and the another controlled terminal of the transistor 602. A current sink may be connected to terminal IS and the current Is may be determined or measured. An output 607 of the operational amplifier 604 may be coupled or connected to a control input, for example a gate, of the transistor 602.

The current Iload may be determined as follows:

The target ratio $dK_{ILIS}$ may be set as described above. The control unit 106 may output a control signal 328 with a value z to adjust the resistance $R_{SH,IC}$ of the second resistor 104. During setting the resistance ratio, the transistor M0 may be turned off or the current flowing through it may be held constant, so as not to influence the voltage V1a, V1b. After the ratio is set, the current supply 312 may be turned off, that is $I_{L1}=I_{L2}=I_2=0$ by the control unit 106.

The operational amplifier 604 may force voltages V1 and V2 to be equal, that is V1=V2, by adjusting the current Is flowing through transistor 602. If it may be assumed that there is no voltage drop across resistor 304, for example if there is no current flow into the control unit 106 and into the positive input 603 of the operational amplifier 604, this may result in:

$$R_{BDW} \cdot Iload = R_{SH,IC} \cdot Is \tag{10}$$

In contrast to setting the resistance ratio, where the voltages V1 and V2 are matched by varying the resistance $R_{SH,IC}$ and keeping the currents $I_{L1}$, $I_{L2}$ constant, the resistance $R_{SH,IC}$ is held constant here and the current Is is varied in order to match the voltages V1 and V2. The load current may than the calculated by $$Iload = Is \cdot R_{SH,IC}/R_{BDW} = dK_{ILIS} \cdot Is \tag{11}$$

Figure 7:
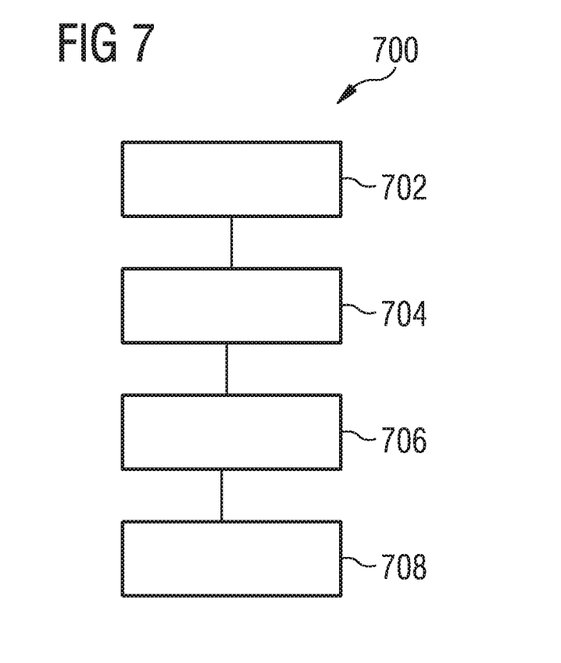
FIG. 7 shows an embodiment of a method for current measuring.

FIG. 7 shows an embodiment 700 of a method for measuring a current. The method may include a step 702 of setting the ratio of the resistance $R_{SH,IC}$ of the second resistor 104 to the resistance $R_{BDW}$ of the first resistor 102, for example as described in conjunction with embodiments 100 to 500. The method may include a step 704 of providing a current flow Iload through the first resistor 102. The method may include a step 706 of determining the current flow Is through the second resistor 104. The method may include a step 708 of determining the current flow Iload through the first resistor 102 based on the ratio of the resistance $R_{SH,IC}$ of the second resistor 104 to the resistance $R_{BDW}$ of the first resistor 102 and the current flow Is through the second resistor 104.

In various embodiments, the method may further include coupling the first resistor 102 and the second resistor 104 to a common supply voltage Vs. For example, the first resistor 102 may be directly connected to the supply voltage and the second resistor 104 may be coupled via the resistor 302 to the supply voltage, as is shown in FIG. 6.

In various embodiments, determining the current flow Is through the second resistor 104 may include regulating the current flow through the second resistor 104 until a voltage V1 due to the current flow Iload through the first resistor 102 is equal to a voltage V2 due to the current flow Is in the second resistor 104.

In various embodiments, the ratio is set at at least one of the following times: before providing a current flow Iload through the first resistor 102; at predetermined times, for example periodically or at set intervals; when the target ratio $dK_{ILIS}$ is changed; and after a change in conditions that may change the resistance of the first resistor 102 or the second resistor 104, such as for example a change in temperature. The ratio may also be set after a user input, for example if the user decides that the ratio may have changed.

In various embodiments, the current flow Iload through the first resistor 102 is turned off or kept at a constant value when setting the ratio of the resistance $R_{BDW}$ of the first resistor 102 to the resistance $R_{SH,IC}$ of a second resistor 104.

In various embodiments, the first current $I_{L1}$, the another first current $I_{L2}$ and the second current $I_2$ are turned off before providing the current flow Iload through the first resistor 102.

The embodiments of the circuits and the methods described above may have the following error sources:

The second resistor 104 may include several smaller resistors with a resistance $R_T$. The resistance $R_T$ in relation to a maximum resistance $R_{SH,IC,MAX}$ of the second resistor 102 may cause a quantization error, which may be about 0.5 to 1.5%.

The uncertainties in the ratios $K_1$ and $K_2$ may also present an error source. The resistors 406, 408, 502 determining the ratios $K_1$ and $K_2$ may consist of the same material. An accuracy of 1.5% may be possible by matching, which may be reduced to less than 1% with frontend trimming.

The offset voltage $U_{OFFSET,Komparator}$ of the comparator 326 may be eliminated provided that it remains constant.

Variations in the output voltage of the operational amplifier 402 will not be a source of errors for $K_1$ and $K_2$ as the geometries of the transistors may be chosen so that the operational amplifier 402 has the same load.

Noise may also be a considerable source of error since the expected voltage levels at the first resistor 102 may only be about a few hundred micro volts ($\mu V$). This source of error may be reduced by a low pass in the signal path SHS with a capacitance on the side of the comparator 326. A capacitance of about 10 pF may result in an effective noise voltage of about 20 $\mu V$. The low pass may also improve electromagnetic interference properties.

As an example, the first resistance 102 may be a bond wire with a diameter of 600 $\mu m$ and a length of about 3.5 mm. With production tolerances of ±15% and at a temperature −40° C., its lowest resistance may be $R_{BDW}=231\Omega$. Let $I_{L1}=1$ A and $K_2=3$ to give $I_{L3}=3$ A. The signal magnitude of the differential measurement $R_{BDW} \cdot I_{L1}$ and $R_{BDW} \cdot I_{L2}$ may be about 462 $\mu V$ and the deviation due to noise may be 2.20 $\mu V=40 \mu V$, which is about ±8.7%. Adding errors caused by inaccuracies of the factors $K_1$ and $K_2$ and the limited resolution $R_T/R_{SH,IC,MAX}$ of the second resistor 104 may give a variation of ±12% for the ratio of the resistances $dK_{ILIS}$. The accuracy may be even higher if a bond wire with a larger resistance is used. Increasing $K_2$ may further increase the accuracy since the signal levels will increase, thus reducing the effect of noise.

The circuits and the methods described above may also be used when the first resistor 102 is a lateral metallization. The target ratio $dK_{ILIS}$ may be set in the off-state of the transistor M0. However, during the on-state, the current distribution in the lateral metallization may change the effective lateral resistance. To compensate this effect, the target ratio $dK_{ILIS}$ may be set again after the transistor M0 is conducting a constant current Iload and the effective lateral resistance does not change anymore.

The circuits and the methods described above may have the following advantages:

The target ratio $dK_{ILIS}$ may be changed easily which allows a simple changing of the measurement range.

Further, the first resistor 102 may be made from a completely different material than the second resistor 104 without losing accuracy if a measurement is performed directly after setting the resistance ratio.

The temperature dependencies of the first resistor 102 and the second resistor 104 should be about the same if the temperature changes between setting the resistance ratio and performing the measurement. However, different environmental dependencies and drift over time may be compensated by setting the resistance ratio shortly before performing the measurement.

The production processes of the first resistor 102 and the second resistor 104 may be different and the production variations may be uncorrelated.

Variations in the length of a bond wire due to the setup of the die attach and the wire bonding which influence the resistance $R_{BDW}$ of the first resistor 102 may be compensated.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit, comprising:
   a first resistor;
   a second resistor with an adjustable resistance;
   a control unit configured:
   to adjust the second resistor to have a first resistance at which a voltage due to a first current flowing through the first resistor is equal to a voltage due to a second current flowing through the second resistor;
   to adjust the second resistor to have a second resistance at which a voltage due to another first current different from the first current and flowing through the first resistor is equal to the voltage due to the second current flowing through the second resistor; and
   to adjust the second resistor to have a third resistance based on at least a difference of the first resistance and the second resistance.

2. The circuit according to claim 1, further comprising:
   a current supply coupled to the first resistor and the second resistor and configured to provide the first current and the another first current to the first resistor and to provide the second current to the second resistor.

3. The circuit according to claim 1,
   wherein a ratio of the first current to the second current is set by a ratio of a first transistor geometry to a second transistor geometry.

4. The circuit according to claim 1,
   wherein a ratio of the first current to the second current is set by a ratio of a resistance of a resistor to a resistance of another resistor.

5. The circuit according to claim 1,
   wherein the ratio of the first current to the second current is equal to 1; or
   between 1,000 and 50,000.

6. The circuit according to claim 1,
   wherein a ratio of the another first current to the first current is set by a ratio of a resistance of a resistor to a resistance of another resistor.

7. The current sensing circuit according to claim 1,
   wherein the ratio of the another first current to the first current is between 1.1 to 20.

8. The circuit according to claim 2,
   wherein the current supply comprises
   a first transistor coupled to the first resistor;
   a second transistor coupled to the second resistor;
   a third transistor coupled via a switch to the second resistor,
   wherein a gate of the first transistor, a gate of the second transistor, and a gate of the third transistor are coupled together and controlled by a feedback loop comprising a switchable voltage divider coupled to a controlled terminal of the first transistor, a controlled terminal of the second transistor, and a controlled terminal of the third transistor.

9. The circuit according to claim 2,
wherein the current supply comprises:
- a first transistor coupled to the first resistor;
- a third transistor coupled to the second resistor,
wherein the current supply is configured:
- to control the first transistor to provide the first current via a feedback loop;
- to control the first transistor and to control the feedback loop to provide the another first current; and
- to control the third transistor to provide the second current via a second feedback loop;

or
wherein the current supply comprises:
- a first transistor and a second transistor coupled in parallel to each other and coupled to the first resistor;
- a third transistor coupled to the second resistor, wherein the current supply is configured:
- to control the first transistor to provide the first current via a first feedback loop;
- to control the third transistor to provide the second current via a second feedback loop;
- to control the first transistor and the second transistor to provide the another first current via a third feedback loop.

10. The circuit according to claim 9,
wherein the current supply is further configured to provide the first current, the second current, the another first current and the second current in that order.

11. The circuit according to claim 9,
wherein the first feedback loop, the second feedback loop and the third feedback loop share a same operational amplifier.

12. The circuit according to claim 2,
wherein the control unit is configured:
- to set the current supply to provide the first current and the second current when adjusting the second resistor to have the first resistance;
- to set the current supply to provide the another first current and the second current when adjusting the second resistor to have the second resistance; and
- to turn off the first current, the another first current and the second current after having adjusted the second resistor to have the third resistance.

13. The circuit according to claim 1,
wherein the control unit comprises a comparator configured to compare the voltage due to the first current or due to the another first current with the voltage due to the second current.

14. The circuit according to claim 13,
wherein the voltages due to the first current and the another first current are stored or are used as offsets for the comparator.

15. The circuit according to claim 1,
wherein the control unit comprises a calculation unit configured to determine the third resistance based on:
- the difference of the first resistance and the second resistance;
- the ratio of the another first current and the first current;
- the ratio of the first current and the second current; and
- a target ratio of a resistance of the second resistor to a resistance of the first resistor.

16. The circuit according to claim 1, further comprising:
a switching element coupled to the first resistor.

17. The circuit according to claim 16, further comprising:
a operational amplifier configured to compare a voltage due to a current in the first resistor with a voltage due to the current in the second resistor.

18. The circuit according to claim 17, further comprising:
a transistor coupled to the second resistor and controlled by the operational amplifier in a feedback loop.

19. The circuit according to claim 1,
wherein the first resistor and the second resistor consist of different materials.

20. The circuit according to claim 1,
wherein the first resistor is a contact resistor of a switching element, for example a bond wire for connecting the switching element or a metallization, for example a lateral metallization, of an electrode, for example of a source electrode, of the switching element.

21. The circuit according to claim 1,
wherein the second resistor has a discretely adjustable resistance, for example provided by switchable polysilicon resistors.

22. The circuit according to claim 1,
wherein at least one of:
- the first resistor; and
- the second resistor has a continuously adjustable resistance, for example provided by a transistor.

23. A method for setting a ratio of a resistance of a first resistor to a resistance of a second resistor, comprising:
- applying a first current to the first resistor to obtain a first voltage;
- applying a second current to the second resistor to obtain a second voltage;
- obtaining a first value of a control signal configured to set the resistance of the second resistor by adjusting a value of the control signal until a difference between the first voltage and the second voltage vanishes or changes its sign;
- applying another first current to the first resistor to obtain another first voltage, wherein the another first current differs from the first current;
- applying the second current to the second resistor to obtain a another second voltage;
- obtaining a second value of the control signal by adjusting the value of the control signal until the difference between the another first voltage and the another second voltage vanishes or changes its sign;
- determining a third value of the control signal based on the difference of the first value and the second value; and
- setting the resistance of the second resistor by means of the third value of the control signal.

24. The method according to claim 23,
wherein determining the third value is further based on at least one of:
- a ratio of the first current and the second current;
- a ratio of the another first current and the first current; and
- a target ratio of the resistance of the second resistor to a resistance of the first resistor.

25. A method for measuring a current, comprising:
- setting the ratio of the resistance of the first resistor to the resistance of a second resistor according to claim 23;
- providing a current flow through the first resistor;
- determining the current flow through the second resistor; and
- determining the current flow through the first resistor based on the ratio of the resistance of the first resistor to the resistance of a second resistor and the current flow through the second resistor.

26. The method of claim 25, further comprising:
coupling the first resistor and the second resistor to a common supply voltage.

27. The method of claim 25, wherein
determining the current flow through the second resistor comprises regulating the current flow through the second resistor until a voltage due to the current flow through the first resistor is equal to a voltage due to the current flow in the second resistor.

28. The method of claim 25, wherein
the ratio is set at at least one of the following times:
before providing a current flow through the first resistor;
at predetermined times;
when the target ratio is changed;
after a user input; and
after a change in temperature.

29. The method of claim 25, wherein
the current flow through the first resistor is turned off or kept at a constant value when setting the ratio of the resistance of the first resistor to the resistance of a second resistor.

30. The method of claim 25, wherein
the first current, the another first current and the second current are turned off before providing the current flow through the first resistor.

* * * * *